United States Patent
Hess et al.

(10) Patent No.: US 8,725,299 B2
(45) Date of Patent: May 13, 2014

(54) CUSTOMER EQUIPMENT PROFILE SYSTEM FOR HVAC CONTROLS

(75) Inventors: Mark D. Hess, Plano, TX (US); Richard A. Mauk, Lewisville, TX (US); John G. Thomas, McKinney, TX (US)

(73) Assignee: Lennox Industries, Inc., Richardson, TX (US)

( * ) Notice: Subject to any disclaimer, the term of this patent is extended or adjusted under 35 U.S.C. 154(b) by 920 days.

(21) Appl. No.: 12/694,423

(22) Filed: Jan. 27, 2010

(65) Prior Publication Data

US 2010/0298985 A1 Nov. 25, 2010

Related U.S. Application Data

(60) Provisional application No. 61/180,405, filed on May 21, 2009.

(51) Int. Cl.
*G01M 1/38* (2006.01)
*G05B 15/00* (2006.01)
*G05D 23/00* (2006.01)

(52) U.S. Cl.
USPC .......................................... 700/276; 700/277

(58) Field of Classification Search
USPC ................................................ 700/276–277
See application file for complete search history.

(56) References Cited

U.S. PATENT DOCUMENTS

| | | | |
|---|---|---|---|
| 5,805,443 A | 9/1998 | Raffray et al. | |
| 6,851,621 B1 * | 2/2005 | Wacker et al. | 236/51 |
| 7,047,092 B2 * | 5/2006 | Wimsatt | 700/83 |
| 7,089,088 B2 * | 8/2006 | Terry et al. | 700/276 |
| 7,146,253 B2 * | 12/2006 | Hoog et al. | 700/276 |
| 7,225,054 B2 * | 5/2007 | Amundson et al. | 700/276 |
| 7,225,171 B2 * | 5/2007 | Kikuchi et al. | 705/412 |
| 7,274,972 B2 * | 9/2007 | Amundson et al. | 700/276 |
| 7,274,973 B2 * | 9/2007 | Nichols et al. | 700/276 |
| 7,415,102 B2 | 8/2008 | Iggulden et al. | |
| 7,434,742 B2 * | 10/2008 | Mueller et al. | 236/46 C |
| 7,572,989 B2 | 8/2009 | Deshimaru | |
| 7,873,441 B2 * | 1/2011 | Synesiou et al. | 700/286 |
| 7,941,530 B2 | 5/2011 | Ha et al. | |
| 8,032,254 B2 * | 10/2011 | Amundson et al. | 700/276 |
| 2007/0114291 A1 * | 5/2007 | Pouchak | 236/44 C |
| 2008/0120446 A1 * | 5/2008 | Butler et al. | 710/63 |
| 2008/0178615 A1 * | 7/2008 | Yoon et al. | 62/79 |
| 2008/0223944 A1 | 9/2008 | Helt et al. | |
| 2009/0143878 A1 * | 6/2009 | Staub et al. | 700/83 |
| 2010/0065245 A1 * | 3/2010 | Imada et al. | 165/59 |
| 2010/0298984 A1 * | 11/2010 | Mauk et al. | 700/276 |
| 2012/0323356 A1 * | 12/2012 | Dziura et al. | 700/121 |

FOREIGN PATENT DOCUMENTS

EP 0652502 A1 11/1994

OTHER PUBLICATIONS

U.S. Appl. No. 60/991,621, filed Nov. 30, 2007; Admundson et al., all pages pertinent.*
Hernan Gomes Duff; Examiner's Report (Office Action); Chile Patent Office; Oct. 7, 2010; 5 pages.
European Search Report dated Feb. 14, 2013, Application No. 10188813.9-1807, Applicant: Lennox Industries, Inc., 7 pages.

* cited by examiner

*Primary Examiner* — Ronald Hartman, Jr.

(57) ABSTRACT

Disclosed herein is a heating, ventilating, and air conditioning (HVAC) unit and controller with memory provisions for storing, receiving, and transmitting customer equipment profiles. The controller may include a plurality of profiles that allows a selection thereof for restoration. A method for configuring HVAC equipment, including a customer profile database and efficiently transmitting unique customer and factory profiles, is also disclosed.

19 Claims, 3 Drawing Sheets

CUSTOMER EQUIPMENT PROFILE SYSTEM FOR HVAC CONTROLS

CROSS-REFERENCE TO RELATED APPLICATION

This application claims the benefit of U.S. Provisional Application Ser. No. 61/180,405, filed by Mark Beste, et al., on May 21, 2009, entitled "Comprehensive HVAC Control System," and incorporated herein by reference in its entirety.

TECHNICAL FIELD

This application is directed, in general, to heating, ventilating and air conditioning (HVAC) systems and, more specifically, to configuring HVAC systems to include a customer profile.

BACKGROUND

HVAC systems can be used to regulate the environment within an enclosed space. Typically, an air blower is used to pull air from the enclosed space into the HVAC system through ducts and push the air back into the enclosed space through additional ducts after conditioning the air (e.g., heating, cooling or dehumidifying the air). Various types of HVAC systems, such as rooftop units, may be used to provide conditioned air for enclosed spaces.

Many HVAC systems have been improved with various options to provide higher efficiency and better comfort. Accordingly, HVAC systems have typically become more complex resulting in a cost increase for installation and service.

For example, set-up of commercial rooftop units can require over a hundred configuration changes and a high level of technical expertise. For installations and service, technicians need to know the unique settings required to properly configure an HVAC unit. The settings may affect operation of the HVAC unit such as cooling, heating, communications, alarms, set points and other additional parameters associated with the HVAC unit. In some installations having multiple rooftop units, additional labor may be required even if some of the rooftop units are to be configured the same.

SUMMARY

In one aspect, an HVAC controller is disclosed that includes: (1) an interface configured to receive and transmit a customer equipment profile for the HVAC equipment, the customer equipment profile associated with a customer of the HVAC equipment, (2) a memory coupled to the interface and configured to store the customer equipment profile and (3) a processor configured to employ the customer equipment profile to configure the HVAC equipment, the customer equipment profile uniquely tailored for the HVAC equipment and an application of the HVAC equipment for the customer.

In another aspect, a method for configuring HVAC equipment is disclosed that includes: (1) receiving a customer equipment profile for the HVAC equipment, the customer equipment profile associated with a customer of the HVAC equipment, (2) storing the customer equipment profile in a memory of an HVAC controller and (3) configuring the HVAC equipment employing the customer equipment profile, the customer equipment profile uniquely tailored for the HVAC equipment and an application of the HVAC equipment for the customer.

In yet another aspect, a HVAC system is provided that includes: (1) a refrigeration circuit having at least one compressor, a corresponding evaporator coil and a corresponding condenser coil, (2) an indoor air blower configured to move air across the evaporator coil, (3) an outdoor fan configured to move air across the condenser coil and (4) a controller coupled to the refrigeration circuit, the indoor air blower and the outdoor fan. The controller including: (4A) an interface configured to receive and transmit a customer equipment profile for the HVAC system, the customer equipment profile associated with a customer of the HVAC system, (4B) a memory coupled to the interface and configured to store the customer equipment profile and (4C) a processor configured to employ the customer equipment profile to configure the HVAC system, the customer equipment profile uniquely tailored for the HVAC system and an application of the HVAC system for the customer.

BRIEF DESCRIPTION

Reference is now made to the following descriptions taken in conjunction with the accompanying drawings, in which.

DETAILED DESCRIPTION

This disclosure provides embodiments for configuring HVAC equipment during manufacturing, installation, service or repair. By employing the disclosed embodiments, the amount of time needed to configure HVAC equipment and the number of errors associated therewith may be reduced. As disclosed in different embodiments herein, configuration data for one HVAC unit may be used to configure other HVAC units at the same installation. Additionally, HVAC units may be at least partially pre-configured before being installed at a particular site. In other words, at least some configuration of HVAC units may be performed at the manufacturers. Furthermore, the HVAC units may be easily restored after an outage or after maintenance by employing stored configuration profiles located on an HVAC controller associated with the HVAC units. Accordingly, the cost for installation or service labor may be reduced.

For configuring HVAC equipment, customer equipment profiles are employed that are uniquely tailored for the HVAC equipment and an application of the HVAC equipment for a customer. An application is an installation of the HVAC equipment at a site for the customer. For example, the application may be for a school, restaurant, grocery store, factory, etc.

The customer equipment profiles include application-specific data for configuring HVAC equipment. The customer equipment profiles may include, for example, operating parameters, serial numbers and settings for the various components of an HVAC unit. As such, the customer equipment profiles may be unique profiles associated with a specific HVAC unit and a specific application of the HVAC unit for a customer.

A controller for a HVAC unit is configured to receive, store and employ the customer equipment profiles for the HVAC unit. The profile data may be stored using encryption and accessed with security password or software keys. In addition to operating parameters and serial numbers, the customer equipment profiles may include: customer contact and preferred service information; factory installed options; field installed option list; setpoints related to heating cooling and unit controls; unit operating modes, sensor communications and network interface settings; date, time, author for last profile change; and overall notes for application usage.

Figure 1:
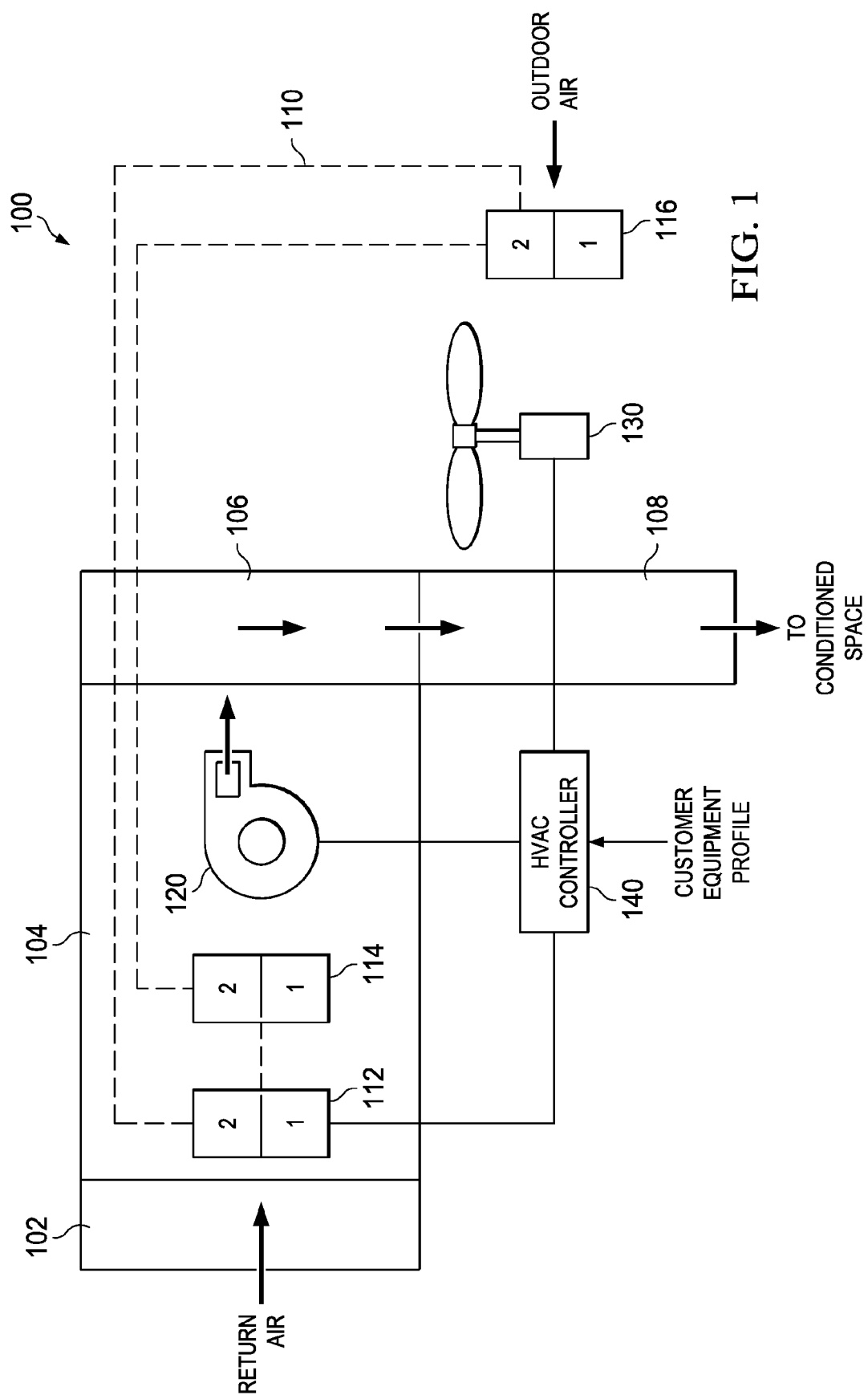
FIG. 1 is a block diagram of an embodiment of an HVAC system constructed according to the principles of the disclosure.

FIG. 1 is a block diagram of an embodiment of a HVAC system 100 constructed according to the principles of the disclosure. The HVAC system 100 includes a return duct 102, a return plenum 104, a supply duct 106 and a supply plenum 108. Additionally, the HVAC system 100 includes a refrigeration circuit 110, an indoor air blower 120, an outdoor fan 130 and a HVAC controller 140. The refrigeration circuit 110 includes a compressor system 112, evaporator coils 114 and condenser coils 116. Each of the components of the refrigeration circuit 110 is fluidly coupled together. The compressor system 112, the evaporator coils 114, and the condenser coils 116 each include two units as denoted by the numbers 1-2 in FIG. 1. The multiple units of the refrigeration system 110 represent two cooling stages of the HVAC system 100. One skilled in the art will understand that this disclosure also applies to other HVAC embodiments having a single cooling stage or more than two cooling stages.

One skilled in the art will also understand that the HVAC system 100 may include additional components and devices that are not presently illustrated or discussed but are typically included in an HVAC system, such as, a power supply, an expansion valve, a temperature sensor, a humidity sensor, etc. A thermostat (not shown) is also typically employed with the HVAC system 100 and used as a user interface. The various illustrated components of the HVAC system 100 may be contained within a single enclosure (e.g., a cabinet). In one embodiment, the HVAC system 100 is a rooftop unit.

The refrigeration circuit 110, the indoor air blower 120, the outdoor fan system 130 and the humidity sensor 140 may be conventional devices that are typically employed in HVAC systems. At least some of the operation of the HVAC system 100 can be controlled by the HVAC controller 140 based on inputs from various sensors of the HVAC system 100 including a temperature sensor or a humidity sensor. For example, the HVAC controller 140 can cause the indoor air blower 120 to move air across the evaporator coils 114 and into an enclosed space.

The HVAC controller 140 may include a processor, such as a microprocessor, configured to direct the operation of the HVAC system 100. Additionally, the HVAC controller 140 may include an interface and a memory section coupled thereto. The interface and memory section may be configured to communicate (i.e., receive and transmit) and store a customer equipment profile for the HVAC system. The customer profile is associated with a customer of the HVAC system 100 and uniquely tailored for the HVAC system 100 and an application of the HVAC system 100 for the customer. The processor employs the customer equipment profile from the memory section to configure the HVAC system 100.

The interface may include multiple ports for transmitting and receiving data. The ports may be conventional receptacles for communicating data via various means such as, a portable memory device, a PC or portable computer or a communications network. The interface is coupled to the memory section, which may be a conventional memory that is constructed to store data and computer programs.

As illustrated in FIG. 1, the HVAC controller 140 is coupled to the various components of the HVAC system 100. In some embodiments, the connections therebetween are through a wired-connection. A conventional cable and contacts may be used to couple the HVAC controller 140 to the various components of the HVAC system 100. In other embodiments, a wireless connection may also be employed to provide at least some of the connections.

Figure 2:
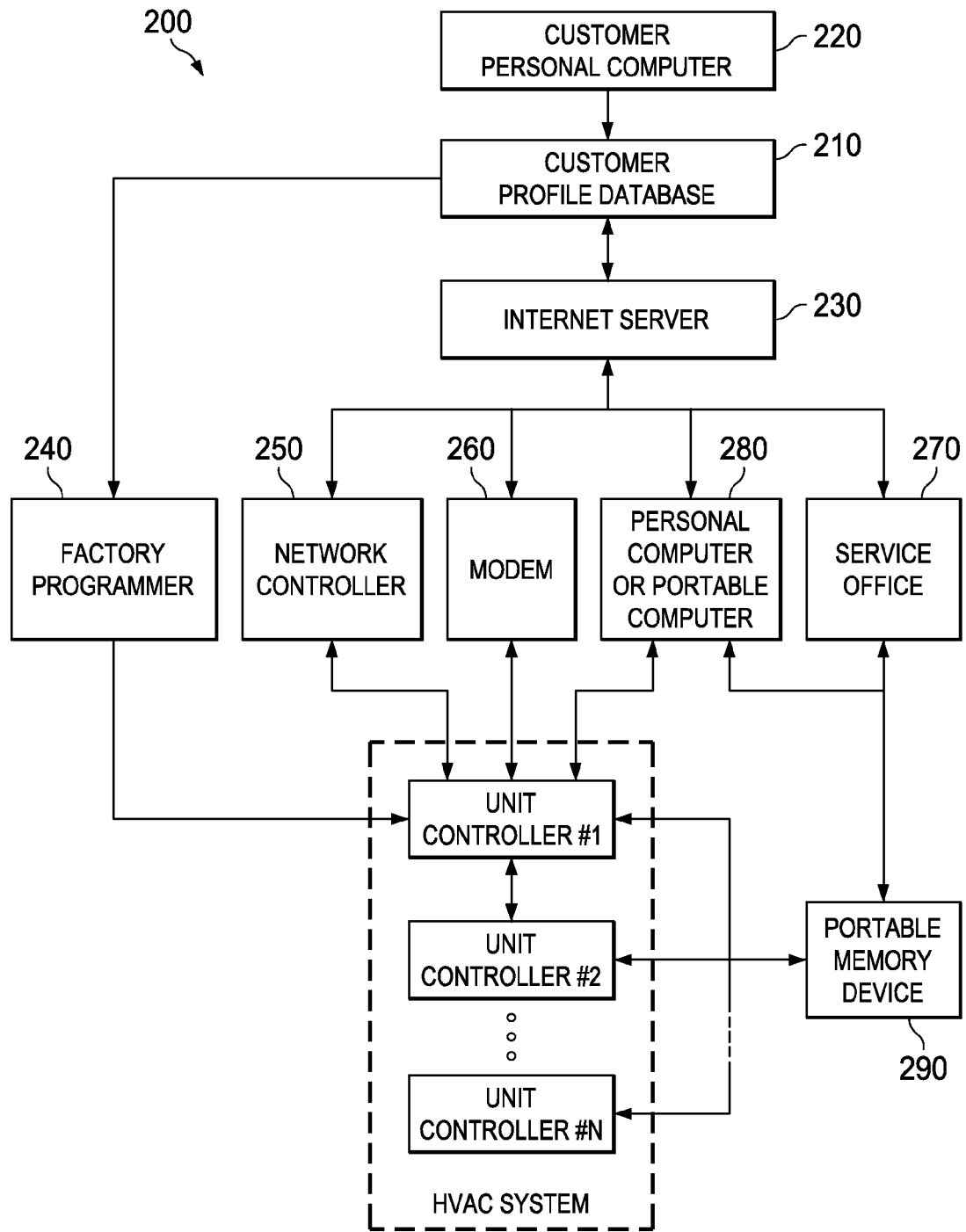
FIG. 2 is a block diagram illustrating a system having various components for delivering customer equipment profiles to an embodiment of a multi-unit HVAC system having HVAC controllers constructed according to the principles of the disclosure.

FIG. 2 is a block diagram illustrating a system 200 having various components for delivering customer equipment profiles to an embodiment of a multi-unit (i.e., N units) HVAC system having HVAC controllers constructed according to the principles of the disclosure. Each HVAC unit of the HVAC system 200 includes a designated controller as represented by unit controller #1, unit controller #2 and unit controller #N in FIG. 2. The illustrated system 200 may be used to deliver customer equipment profiles during manufacturing (i.e., while still at the factory), during installation at an application for a customer, while performing service upgrades or during replacement repairs. The system 200 may be used to deliver the customer equipment profiles to only one controller of the HVAC system (such as unit controller #1 in FIG. 2). However, the illustrated connections for unit controller #1 may apply to multiple of the HVAC controllers of the HVAC system to allow delivery of the customer equipment profile to multiple HVAC controllers of the HVAC system. As such, each specific unit controller of the HVAC system may have similar connections as those coupled to unit controller #1.

The various components of the system 200 allow a customer to pre-configure the HVAC system using access to a customer profile database 210. The customer can access the customer profile database 210 via a communications network, such as through an Internet server 220, or through a direct connection, such as through a PC or portable computer 230.

The customer can generate a profile for the HVAC system that can be stored at the customer profile database 210. Additionally, the customer may employ a profile from a set of general profiles. The general profiles may be stored on the customer profile database 210. The customer can then either select the generated profile or a general profile for the HVAC system. The general profiles may be developed for typical customer applications and designed for improved efficiency or comfort. Example profiles include schools, grocery stores, malls or a mall store, a big box store, a restaurant, a factory, a retail store, etc. During a manufacturing stage, a factory programmer 240 (e.g., a computer) may be used to program at least one of the controllers (e.g., unit controller #1) of the HVAC system with the selected customer equipment profile. Of course, all or multiple of the HVAC controllers for the HVAC system may be programmed during manufacturing. A final test performance may then be performed before shipping. If an HVAC system is in inventory, the corresponding HVAC controller or controllers can be reprogrammed with the selected customer equipment profile prior to shipping. An example of programming during manufacturing is represented by the darkened arrows of FIG. 2.

During installation at the customer's site, testing of the HVAC system may be performed to assure proper operation if the customer equipment profile has already been programmed at the factory. Since factory programming was performed, the testing can be brief. Even if loaded at the factory, the customer equipment profile may be updated. The profile may be updated by employing a network controller 250 of a communications network, such as the Internet, to check a website of the customer for updates. The website may be a specific and secure website of the customer that is designated for such a purpose. Updates may be generated by the manufacturer or customer and provided to an HVAC controller, for example, via a modem 260, or a service office 270. E-mail may be used to provide update notices.

If a customer equipment profile is unknown during installation, a service technician can configure one HVAC unit, record the profile to an external or removable device, such as, a PC or portable computer 280, a portable memory device 290, or the server 230. The portable memory device 290 may be a "pen drive." As is widely known, a pen drive, also called a "memory stick" or a "jump drive," is a solid-state device containing nonvolatile computer memory, typically flash random-access memory (RAM), and a Universal Serial Bus (USB) port that allows external access to the nonvolatile memory.

The customer equipment profile can then be used to program the additional HVAC controllers (i.e., unit controller #2 through unit controller #N) at the specific customer application and may be used for similar future construction sites. By replicating the customer equipment profile, labor and errors may be reduced. Through the various interfaces of the HVAC controllers, a technician, customer or other authorized user may add notes to a customer equipment profile to assist with installation, identify service personnel, provide customer name, or provide reasons for settings of the customer equipment profile.

While providing service, a manufacturer or customer can employ the various interfaces with the HVAC controller to improve an existing profile to provide, for example, better comfort or performance. Updated customer equipment profiles may be stored in the customer profile database 210 and retrieved for service. A notification may be sent to alert a service technician of an available upgrade. Retrieval of the upgrade may be through the illustrated system via an Internet download, a portable computer 280, a portable memory device 290, etc. The customer profile database 210 can be unit specific based on, for example, the serial number of the unit. As such, phone help assistants and service personnel can view unit specific settings and a history of changes. The unit specific information can assist in correctly solving problems in a minimum period of time.

While performing replacement repairs, the customer equipment profile can be used to quickly change settings in a replacement part. The changes can be made at a manufacturer's parts warehouse, a supplier, service personnel offices or onsite at the HVAC unit. Programming in advance may reduce costs and the need for highly skilled service personnel at the site. Additionally, advance programming can reduce the exposure of service personnel to weather extremes while at the site. In the instance when an entire HVAC unit or controller is replaced, the customer equipment profile can be used to restore the previous configuration.

Figure 3:
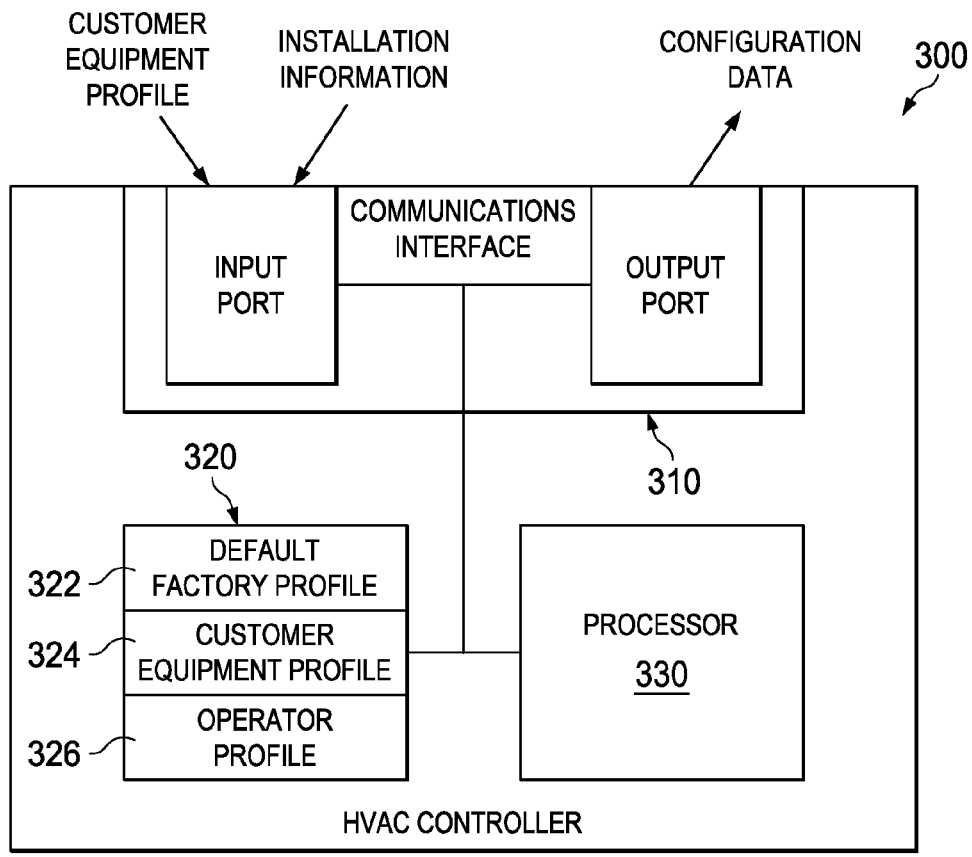
FIG. 3 is a diagram of an embodiment of a HVAC controller constructed according to the principles of the disclosure.

FIG. 3 is a diagram of an embodiment of a HVAC controller 300 constructed according to the principles of the disclosure. The HVAC controller 300 is configured to control operations of an HVAC system. The HVAC controller 300 includes a communications interface 310, a memory 320, and a processor 330. The HVAC controller 300 may also include additional components typically included within a controller for a HVAC system, such as a power supply or power port.

The communications interface 310 may be a conventional device for transmitting and receiving data. The communications interface 310 may include an input port and an output port. In some embodiments, the input and output port may be separate ports. The input and output port, however, may be a single receptacle such as a universal serial bus connection (USB port). The communications interface 310 may include multiple communications ports that are configured to transmit and receive data via different modes. As noted, in one embodiment, the communications interface 310 may include a USB port. In another embodiment, the communications interface 310 may include a direct laptop connection. The communications interface 310 may also include a port for a communications network connection. The communications interface 310 may also include multiple types of communication ports. For example, the communications interface 310 may include a USB connection, a direct laptop connection and a communications network connection. Other combinations and other types of communications ports may also be included.

The memory 320 may be a conventional memory. The memory 320 is coupled to the communications interface and is constructed to store at least one customer equipment profile. The memory 320 may also include a series of operating instructions that direct the operation of the processor 330 when initiated thereby. The series of operating instructions may represent algorithms that are used by the processor 330 to direct configuration of the HVAC system employing the customer equipment profile. The HVAC system may be a rooftop unit. The algorithm may be represented by the flow diagram illustrated in FIG. 4.

The memory 320 may be partitioned into sections for storing various profiles for the HVAC equipment. A first memory section 322 is for a default factory profile. Service personnel may decide to revert to the settings of this profile if the settings of other profiles are suspect. A second memory section 324 is for a customer equipment profile. This is the profile that is used or was used for installation (i.e., the as installed profile). The customer equipment profile may be created during installation using, for example, the HVAC controller 300 or portable computer 280. The HVAC controller 300 may automatically revert to the settings of this profile if memory corruption occurs. Additionally, a technician may select the customer equipment profile 324. A third memory section 326 is for an operational profile. The HVAC controller 300 employs the operational profiles to determine operations for the HVAC system. In some embodiments, the customer equipment profile is the profile that is modified when needed. At reset, the customer equipment profile may then be loaded into the third memory section 326 and be used as the operational profile. Thus, the second and third memory sections 324, 326, may include the same profile. As such, the operational profile may also reflect what is set at the customer location during installation and include settings that are unique to that unit's operation.

The various profiles may be selected from a remote location employing network connections, such as, the Internet. Other networks may also be employed, such as a Building Automation and Control Network (BACnet) developed via the American Society of Heating, Refrigerating and Air-Conditioning Engineers (ASHRAE), or a network that employs the LonTalk protocol from Echelon Corporation of San Jose, Calif.

The processor 330 is configured to employ the customer equipment profile to configure the HVAC equipment. The customer equipment profile is uniquely tailored for the HVAC equipment and an application of the HVAC equipment for the customer. Configuration parameters and instructions may be transmitted via the output port of the communication interface 310.

Figure 4:
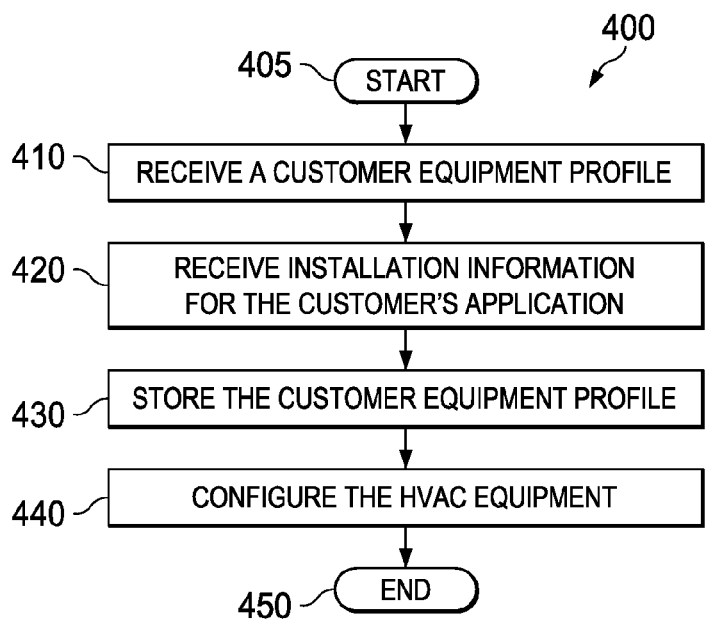
FIG. 4 is a flow diagram of an embodiment of a method for configuring HVAC equipment carried out according to the principles of the disclosure.

FIG. 4 is a flow diagram of an embodiment of a method 400 for configuring an HVAC unit carried out according to the principles of the disclosure. The HVAC unit includes a refrigeration circuit, an indoor air blower system and an outdoor fan system. An HVAC controller such as described with respect to FIG. 1, FIG. 2 or FIG. 3 may be used to perform the method 400. The method 400 may represent an algorithm that is stored on a computer readable medium, such as a memory of an HVAC controller (e.g., the memory 320 of FIG. 3) as a series of operating instructions that can direct the operation of a processor (e.g., the processor 330 of FIG. 3) to configure the HVAC unit. The method 400 begins in a step 405.

In a step 410, a customer equipment profile is received for the HVAC equipment. The customer equipment profile may be received at an HVAC controller via an interface of the controller. The customer equipment profile may be received by the HVAC controller before shipping of the HVAC equipment from a manufacturer. The HVAC equipment, therefore, can be configured for a particular installation before being shipped from the manufacturer. Alternatively, the HVAC controller is ready to configure the HVAC equipment during installation. Either way, configuration time for the HVAC equipment can be greatly reduced during installation.

At least a portion of the customer equipment profile may be generated by the customer. Thus, the customer can provide details that are pertinent to their particular application. The customer equipment profile may be received from a HVAC equipment profile database. The customer equipment profile may be received via a factory controller programmer or a personal computer. In one embodiment, the customer equipment profile may be received over a computer network (i.e., a communications network). Alternatively, the customer equipment profile may be received from a portable memory device.

Installation information for the application is also received in a step 420. The installation information may be included as part of the customer equipment profile. The installation information may include, for example, customer contact information, overall notes for application usage, and preferred service information.

In a step 430, the customer equipment profile is stored in a memory of the HVAC controller. The memory may be coupled to the interface of the HVAC controller and store the customer equipment profile when received therefrom. The customer equipment profile may be stored in the memory including the installation information.

The HVAC equipment is configured in a step 440 employing the customer equipment profile. The customer equipment profile is uniquely tailored for the HVAC equipment and an application of the HVAC equipment for the customer. The method 400 then ends in a step 450.

The above-described methods may be embodied in or performed by various conventional digital data processors, microprocessors or computing devices, wherein these devices are programmed or store executable programs of sequences of software instructions to perform one or more of the steps of the methods, e.g., steps of the method of FIG. 4. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computing devices to perform one, multiple or all of the steps of one or more of the above-described methods, e.g., one or more of the steps of the method of FIG. 4. Additionally, an apparatus, such as dedicated HVAC controller, may be designed to include the necessary circuitry to perform each step of the methods of FIG. 4.

Those skilled in the art to which this application relates will appreciate that other and further additions, deletions, substitutions and modifications may be made to the described embodiments.

What is claimed is:

1. A controller for heating, ventilating and air conditioning (HVAC) equipment, comprising:
   an interface configured to receive and transmit a customer equipment profile for said HVAC equipment, said customer equipment profile associated with a customer of said HVAC equipment;
   a memory coupled to said interface and configured to store said customer equipment profile; and
   a processor configured to employ said customer equipment profile to configure said HVAC equipment, said customer equipment profile uniquely tailored for said HVAC equipment and an application of said HVAC equipment for said customer, wherein said customer equipment profile is based on one of general profiles representing typical applications for said HVAC equipment.

2. The HVAC controller as recited in claim 1 wherein said customer equipment profile is based on configuration data from another HVAC unit.

3. The HVAC controller as recited in claim 1 wherein said set of general profiles are selected from the group consisting of:
   a school,
   a grocery store,
   a mall store,
   a big box store,
   a restaurant,
   a factory, and
   a retail store.

4. The HVAC controller as recited in claim 1 wherein said interface includes a universal serial bus port.

5. The HVAC controller as recited in claim 4 wherein said interface includes a connection for a personal computer or a portable computer.

6. The HVAC controller as recited in claim 5 wherein said interface includes connection for a communications network.

7. The HVAC controller as recited in claim 1 wherein said controller is a rooftop unit controller.

8. The HVAC controller as recited in claim 1 wherein said memory has a first, second and third memory section, wherein said first memory section includes a default factory profile, said second memory section includes said customer equipment profile, and said third memory section includes an operational profile for said HVAC equipment.

9. A method for configuring heating, ventilating and air conditioning (HVAC) equipment, said method comprising:
   receiving a customer equipment profile for said HVAC equipment, said customer equipment profile associated with a customer of said HVAC equipment;
   storing said customer equipment profile in a memory of an HVAC controller; and
   configuring said HVAC equipment employing said customer equipment profile, said customer equipment profile uniquely tailored for said HVAC equipment and an application of said HVAC equipment for said customer, wherein said customer equipment profile is received by said HVAC controller from a HVAC equipment profile database.

10. The method as recited in claim 9 wherein at least a portion of said customer equipment profile is generated by said customer.

11. The method as recited in claim 9 wherein said receiving and storing and configuring occur before shipping of said HVAC equipment from a manufacturer.

12. The method as recited in claim 9 wherein said configuring occurs before shipping of said HVAC equipment from a manufacturer.

13. The method as recited in claim 9 further comprising receiving installation information for said application and storing said installation information as part of said customer equipment profile.

14. The method as recited in claim 9 wherein said customer equipment profile is received by said HVAC controller from a portable memory device.

15. The method as recited in claim 9 wherein said customer equipment profile is received by said HVAC controller over a communications network.

16. The method as recited in claim 9 wherein said customer equipment profile is based on configuration data from another HVAC equipment.

17. A heating, ventilating and air conditioning (HVAC) system, comprising:
- a refrigeration circuit having at least one compressor, a corresponding evaporator coil and a corresponding condenser coil;
- an indoor air blower configured to move air across said evaporator coil;
- an outdoor fan configured to move air across said condenser coil; and
- a controller coupled to said refrigeration circuit, said indoor air blower and said outdoor fan, said controller comprising:
  - an interface configured to receive and transmit a customer equipment profile for said HVAC system, said customer equipment profile associated with a customer of said HVAC system;
  - a memory coupled to said interface and configured to store said customer equipment profile; and
  - a processor configured to employ said customer equipment profile to configure said HVAC system, said customer equipment profile uniquely tailored for said HVAC system and an application of said HVAC system for said customer.

18. The HVAC system as recited in claim 17 wherein said memory has a first, second and third memory section, wherein said first memory section includes a default factory profile, said second memory section includes said customer equipment profile, and said third memory section includes an operational profile for said HVAC equipment.

19. The HVAC system as recited in claim 17 wherein said interface includes a universal serial bus connection and a network connection.

* * * * *